(12) United States Patent
Takakusaki et al.

(10) Patent No.: US 7,163,841 B2
(45) Date of Patent: Jan. 16, 2007

(54) METHOD OF MANUFACTURING CIRCUIT DEVICE

(75) Inventors: Sadamichi Takakusaki, Gunma (JP); Yusuke Igarashi, Gunma (JP); Motoichi Nezu, Gunma (JP); Takaya Kusabe, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/179,431

(22) Filed: Jul. 11, 2005

(65) Prior Publication Data
US 2006/0024862 A1    Feb. 2, 2006

(30) Foreign Application Priority Data
Jul. 29, 2004    (JP)    ............... P.2004-222115

(51) Int. Cl.
*H01L 21/49*    (2006.01)
(52) U.S. Cl. ............... 438/108; 257/E21.503
(58) Field of Classification Search ............ 438/6, 438/17, 22, 25, 29, 96, 106, 108, 110, 118, 438/126–127, 149, 151, 166, 209, 486, 502, 438/616, 622, 660, 689, 672, 690, 720, 754
See application file for complete search history.

(56) References Cited

U.S. PATENT DOCUMENTS

| | | | |
|---|---|---|---|
| 6,809,021 B1 * | 10/2004 | Ohtani et al. | 438/622 |
| 2002/0094604 A1 * | 7/2002 | Hayama et al. | 438/108 |
| 2003/0160317 A1 * | 8/2003 | Sakamoto et al. | 257/690 |
| 2004/0115849 A1 * | 6/2004 | Iwafuchi et al. | 438/25 |
| 2004/0171190 A1 * | 9/2004 | Nishitani et al. | 438/106 |
| 2005/0142852 A1 * | 6/2005 | Asami et al. | 438/624 |
| 2005/0250310 A1 * | 11/2005 | Ogawa | 438/622 |
| 2005/0258547 A1 * | 11/2005 | Terui | 257/777 |

* cited by examiner

*Primary Examiner*—Michael Lebentritt
*Assistant Examiner*—Andre' Stevenson
(74) *Attorney, Agent, or Firm*—Fish & Richardson, P.C.

(57) ABSTRACT

To provide a method of manufacturing a highly reliable circuit device realizing a smaller, thinner and lighter configuration. In the method of manufacturing a circuit device according to the invention, a resin sealed body is separated from a supporting substrate, after the resin sealed body containing a circuit device is formed on a top surface of the supporting substrate. Therefore, manufacture of a circuit device having no substrate becomes possible and it realizes a thinner and lighter circuit device with improved heat dissipation. Moreover, since sealing with a sealing resin can be performed on the supporting substrate, warps, caused by the differences in thermal expansion coefficients between the sealing resin and conductive patterns and between the sealing resin and circuit components, can be prevented. Hence, it becomes possible to prevent flaking of conductive patterns from the substrate and a poor contact between the conductive patterns and a metal thin wire, and consequently to manufacture a highly reliable circuit device.

7 Claims, 9 Drawing Sheets

METHOD OF MANUFACTURING CIRCUIT DEVICE

BACKGROUND OF THE INVENTION

Priority is claimed to Japanese Patent Application Number JP2004-222115 filed on Jul. 29, 2004, the disclosure of which is incorporated herein by reference in its entirety.

1. Technical Field

The present invention relates to a method of manufacturing a circuit device, more particularly to a method of manufacturing a circuit device whereby a thin-profile circuit device is realized.

2. Related Art

As electric appliances have become smaller in size and more sophisticated, miniaturization and density growth for circuit devices used therein has come to be required. With reference to FIGS. 9A to 9C, an example of a method of manufacturing a conventional circuit device will be described. The technology is described for instance in Japanese Patent Application Publication No. 2002-26198.

First, as shown in FIG. 9A, a contact hole 103 is formed on a substrate 101 formed of an insulating material such as resin, by use of a laser or the like. Thereafter, plated films 102A and 102B are formed on both sides of the substrate 101, including space inside the contact hole 103.

Subsequently, in FIG. 9B, by etching the plated films 102A and 102B, a first conductive pattern 102A is formed on the top surface of the substrate 101, and a second conductive pattern 102B on the back surface.

As shown in FIG. 9C, a semiconductor element 104 is mounted on the first conductive pattern 102A, and the first conductive pattern 102A and the semiconductor element 104 are connected electrically through a metal thin wire 105. Subsequently, the semiconductor element 104, the metal thin wire 105 and the first conductive pattern 102A are sealed with a sealing resin 107 to be covered therewith. Finally, the second conductive pattern 102B is coated with a solder resist 109, and an external electrode 108 is formed at the predetermined location. In this manner, a circuit device 100 is produced.

In the method of manufacturing the above-mentioned circuit device, however, a glass epoxy substrate has been used as the substrate 101, for supporting wirings during manufacturing processes. Therefore, it involves problems such as an increase in manufacturing cost, and limitations in producing smaller, thinner and lighter circuit devices due to the thickness of the substrate 101. Moreover, it has been pointed out that a heat dissipation property diminishes as a result of using the glass epoxy substrate.

Further, when the sealing resin 107 is being hardened, warps have been caused by the differences in thermal expansion coefficients between the substrate 101 and the sealing resin 107 as well as between the semiconductor element 104 and the sealing resin 107. This have developed into such a problem that the conductive pattern flakes off from the substrate 101, or that a poor contact occurs between the first conductive pattern 102B and the metal thin wire 105.

Still further, in the case where the glass epoxy substrate was adopted for the substrate 101, it has been critical to form the contact hole 103 for electric connection between the two surfaces thereof, thus prolonging the manufacturing process.

Furthermore, in the case of forming a conductive pattern where a large current flows, the electric capacity thereof has been ensured by increasing the planar dimension of a conductive pattern. Hence, miniaturization of a circuit device has been difficult.

SUMMARY OF THE INVENTION

The present invention is made in consideration of the aforementioned problems. The main object of the present invention is to provide a method of manufacturing a highly reliable circuit device realizing a smaller, thinner and lighter circuit device.

According to one aspect of the present invention, a method for manufacturing a circuit device includes the steps of: forming a wiring layer on a supporting substrate, the wiring layer being composed of a first conductive pattern and a second conductive pattern, the second conductive pattern being formed to be thicker than the first conductive pattern; connecting the wiring layer and a circuit component electrically; sealing the top surface of the supporting substrate with a sealing resin in order that the circuit element is coated; and then separating the back surfaces of the wiring layer and the sealing resin from the supporting substrate. In this manner, it is made possible to manufacture a circuit device with no substrate, which enables a circuit device to attain a thinner and lighter configuration, and an improved heat dissipation property, as well as a lower manufacturing cost. In addition, since conductive patterns with different thicknesses can be formed within one circuit device, circuit device can be made smaller by forming each conductive pattern in accordance with a required amount of current.

Moreover, according to another aspect of the present invention, a method for manufacturing a circuit device includes the steps of: forming a first wiring layer on a surface of a supporting substrate, the first wiring layer having a salient protruding in the thickness-wise direction thereof; depositing a conductive film on the first wiring layer, with an insulation layer interposed therebetween; forming a contact part for providing electrical continuity between the salient and the conductive film; forming a second wiring layer by patterning the conductive film; connecting the second wiring layer and a circuit element electrically; sealing a top surface of the supporting substrate with a sealing resin in order that the circuit element is coated; and separating the back surfaces of the first wiring layer, the insulation film and the sealing resin from the supporting substrate. Therefore, in addition to the effects mentioned above, a circuit device can be made denser by enabling the multi-layered wiring.

According to a method of manufacturing a circuit device in preferred embodiments of the invention, a circuit device having no substrate can be manufactured. Consequently, it is possible to attain a thinner and lighter circuit device with an improved heat dissipation property.

Further, according to the method of manufacturing a circuit device in the preferred embodiments of the invention, warps caused by the differences in thermal expansion coefficients between a substrate and a conductive foil, as well as between a sealing resin and a circuit device, can be prevented. Therefore, flaking of a conductive pattern from the substrate, and a poor contact between the conductive pattern and a metal thin wire can be suppressed, and that enables to manufacture a highly reliable circuit device.

Still further, according to the method of manufacturing a circuit device in the preferred embodiments of the invention, forming of a contact hole which has been necessary in a glass epoxy substrate can be omitted, enabling to dramatically cut down the manufacturing process.

Moreover, according to the method of manufacturing a circuit device in the preferred embodiment of the invention, conductive patterns can be formed thickly where a large current flows, which enables to form a smaller circuit device.

Furthermore, according to the method of manufacturing a circuit device in the preferred embodiments of the invention, a through hole can be provided to a insulation layer allowed to be thinly formed with a salient buried therein, whereby it is made possible to easily form a through hole on the insulation layer. Additionally, the through hole can be formed shallowly, thereby facilitating the formation of a plated film into the through hole. Still further, in a case where a plurality of wiring layers are stacked, a contact part which penetrates the insulation layer and provides electrical continuity between wiring layers can be formed.

DESCRIPTION OF THE PREFERRED EMBODIMENTS (First Embodiment)

Figure 1A:
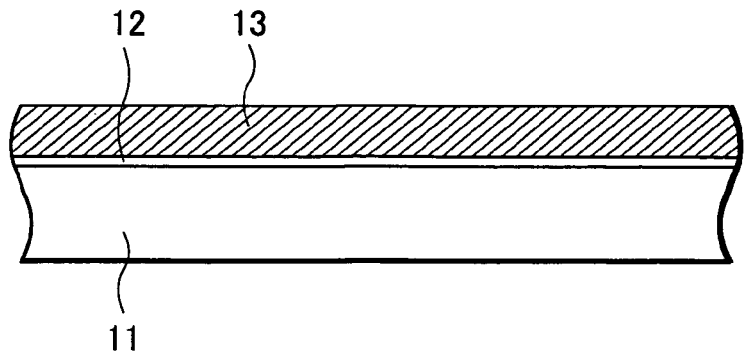
FIGS. 1A to 1C are sectional views showing a method of manufacturing a circuit device according to a first embodiments of the invention.

With reference to FIGS. 1A to 1C and FIGS. 2A to 2C, a method of manufacturing a circuit device according to a first embodiment of the invention will now be described. First, as shown in FIG. 1A, a conductive foil 13 is adhered on a supporting substrate 11 by way of an adhesive material 12 interposed therebetween. A material for the conductive foil 13 is selected considering the adhesive, bonding, and plating properties of soldering material. Specific examples of materials adopted for the conductive foil include a Cu-based conductive foil, Al-based conductive foil, and conductive foils composed of alloy such as Fe—Ni. Other materials can be adopted, and particularly, ones which can be etched are suitable. The thickness of the conductive foil 13 is approximately between 10 µm and 300 µm. However, it is also possible to adopt a conductive foil with thickness of 10 µm or less, or at least 300 µm.

A thermoplastic resin, an UV sheet (of which the adhesive property diminishes by irradiation of ultraviolet ray), or the like is adopted for the adhesive material 12. The adhesive material 12 may be any material which can be resolved into a flux, can be liquefied by heating, or can decrease its adhesive property by ultraviolet ray irradiation thereon.

The supporting substrate 11 may be formed of a material such as metal (Cu, Al, etc.) or resin, which has enough strength or thickness for supporting the conductive foil 13 and keeping it leveled and flat. Further, in a case where the UV sheet is adopted for the adhesive material 12, it is appropriate that a transparent substrate formed of glass, plastic or the like be adopted.

Figure 1B:
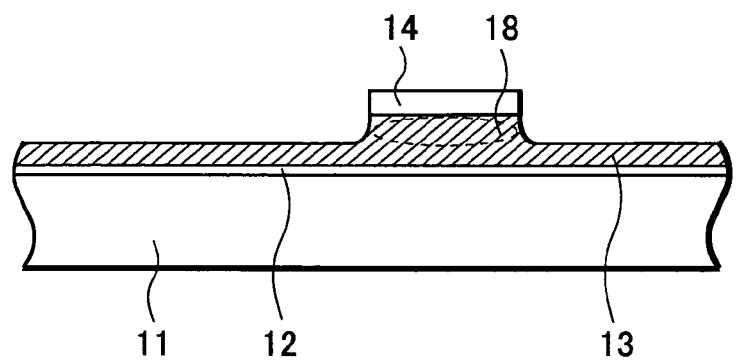

As shown in FIG. 1B, patterning of a resist 14 on the top surface of the conductive foil 13 is performed. Then, wet etching is conducted by using the resist 14 as an etching mask, so as to etch on the main surface where the resist 14 is not formed. This etching forms two types of pattern, a salient 18 and a thin conductive foil. After the etching is completed, the resist 14 is removed.

Figure 1C:
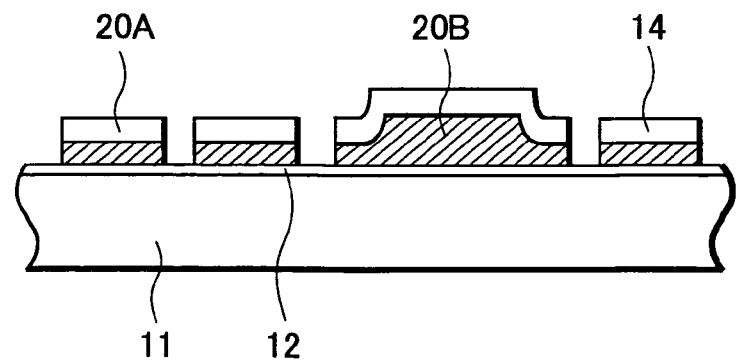

As shown in FIG. 1C, conductive patterns 20A and 20B are formed by etching the conductive foil 13. First, patterning of the resist 14 is performed so as to cover the top surface of the region whereon a conductive pattern is to be formed. Here, the patterning of the resist 14 is performed in order that it coats a wider region than that of the salient 18 which is formed relatively thickly. This is done to enable the etching to be required only on the thinner part, and thereby one-time etching can be sufficient for patterning the conductive foil 13. More specifically, if a displacement of a mask, for example, is taken into consideration, complete separation of the conductive foil 13 can be achieved more credibly when the patterning has been performed in a way that a small portion of extruding edge is formed. Moreover, if the etching is performed in a way that only the thinner part of the conductive foil 13 is separated, the conductive patterns 20A and 20B, which have different thicknesses, are formed while reducing the amount of side etching. On the other hand, if the thicker part of the conductive foil 13, where the salient 18 is formed, is separated by etching, the amount of side etching becomes large. Thus, the widths of the conductive patterns 20A and 20B become narrow.

Therefore, by performing a patterning on conductive patterns with different thicknesses at once on the part of the thinner conductive foil, both thicker and thinner patterns can be formed at once, and for example, respective patterns for power system and small-signal system can be formed in one etching processes.

Further, compliance with a large current can be achieved not by increasing the planar dimension of a conductive pattern but by increasing the thickness of the conductive pattern, which enables to reduce the size of the planar surface of the circuit device.

Still further, the heat dissipation property is improved by arranging a circuit element, which generates a large amount of heat, on the thickly formed conductive pattern.

Figure 2A:
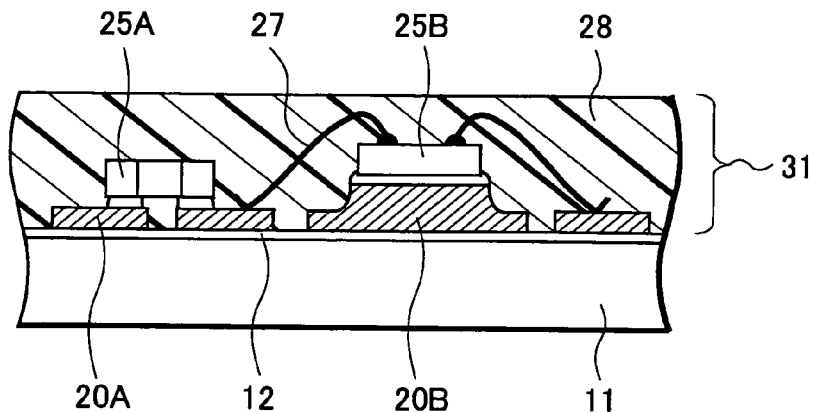
FIGS. 2A to 2C are sectional views showing the method of manufacturing a circuit device according to the first embodiment of the invention.

With reference to FIG. 2A, circuit elements 25A and 25B is mounted on conductive patterns 20, and a resin sealed body 31 sealed by a sealing resin 28 is formed. Here, the first circuit element 25A is mounted on the first conductive pattern 20A, and the second circuit component 25B mounted on the second conductive pattern 20B. As shown in FIG. 2A, the circuit components 25A and 25B are electrically connected to the conductive patterns 20 through a metal thin wire 27. Needless to say, this structure may also be formed facedown.

In this embodiment, a case is described as the one where there are mounted the first circuit element 25A in which a relatively small amount of current flows, and the second circuit element 25B in which a large current flows.

While adoption of a chip condenser for the first circuit element 25A is disclosed, other component such as a transistor, an LSI chip, a chip resistor, or solenoid may also be adopted.

Components for the second circuit element 25B include power-system transistors which provide a flow of a large current, such as a power MOS, a GTBT (Grounded-Trench-MOS Assisted Bipolar-Mode FET), an IGBT (Insulated Gate Bipolar Transistor), and a thyristor. Moreover, a power-system IC may also be adopted. Since chips used in recent years are small-sized and have sophisticated functions, a massive amount of heat is generated compared to those used in the past. Therefore, it is possible to improve the heat dissipation property of a circuit element which needs to release the heat, if the circuit element is mounted on the second conductive pattern 20B.

Moreover, contacts between the circuit elements 25A and 25B and the conductive patterns is achieved faceup or facedown, by using a metal thin wire, a soldering material, a conductive paste and the like. Thereafter, the circuit elements 25A and 25B are sealed by the sealing resin 28. Here, the sealing may be conducted with any of transfer-molding, injection-molding, dipping or spreading. Resin materials for sealing may include a thermosetting resin such as an epoxy resin, or a thermoplastic resin such as a polyimide resin.

Here, the resin sealed body 31 is unified with the supporting substrate 11 having a flat surface, until the sealing resin 28 becomes cured. Thus, its flatness can be maintained.

Figure 2B:
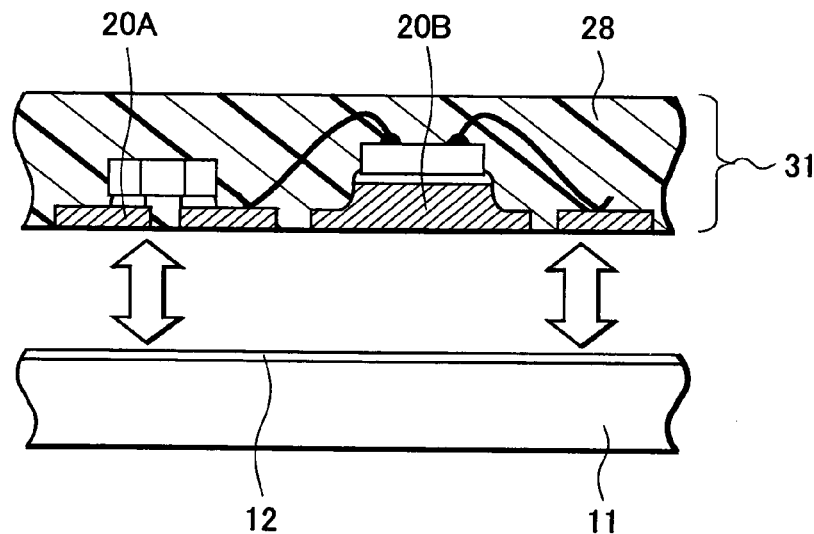

With reference to FIG. 2B, the resin sealed body 31 is separated from the supporting substrate 11. Here, if the thermoplastic resin is adopted for the adhesive material 12, separation can be performed by heating and melting the thermoplastic resin. Further, the adhesive material 12 may also be selectively dissolved with such an agent as an organic solvent.

In the case where the UV sheet is adopted for the adhesive material 12, separation can be performed by radiating ultraviolet rays. Here, by adopting a material through which ultraviolet rays pass, such as glass, for the supporting substrate 11, speedy and effective separation can be achieved.

After the separation from the supporting substrate 11, a part of the adhesive material 12 may remain on the back surface of the resin sealed body 31. This trouble is resolved by dissolving and removing the adhesive material, again using such an agent as an organic solvent.

Figure 2C:
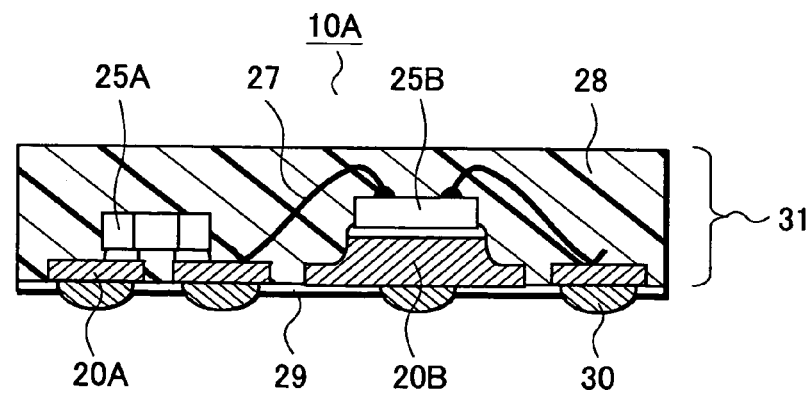

In FIG. 2C, the resin sealed body 31 is processed with a back surface treatment, and thereafter is diced and separated into pieces. Thus, a circuit device 10A is completed. Here, patterning of a solder resist 29 on the back surface of the resin sealed body 31 is performed, and a conductive pattern is exposed, whereat an external electrode 30 formed of a soldering material for example, is formed. However, it is possible to let the conductive pattern 20, that is exposed from the back surface of the resin sealed body 31, serve as external electrodes.

With the structure mentioned above, a thin conductive pattern and a thick conductive pattern are formed, enabling a power-system element and a small-signal system element to be put together into one package. In a case where 6 power components and one controlling IC are packaged into a single package as an inverter module for example, it becomes possible to have a SIP (single in-line package) in one package if: sources and drains of 6 power components may be electrically connected to the thick conductive pattern; and the IC which controls a gate or a power transistor may be connected to the thin conductive pattern.

(Second Embodiment)

With reference to FIGS. 3A to 5C, a method of manufacturing a circuit device according to a second embodiment of the invention will now be described. The basic process of the method of manufacturing a circuit device in the second embodiment is similar to that of the first embodiment. Therefore, the differences will be mainly described here.

Figure 3A:
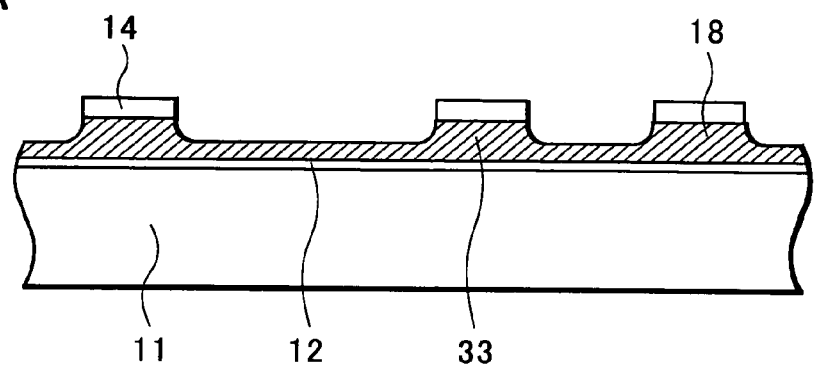
FIGS. 3A to 3C are sectional views showing a method of manufacturing a circuit device according to a second preferred embodiment of the invention.

First, with reference to FIG. 3A, a salient 18 is formed on a first conductive film 33 adhered on a supporting substrate 11 through an adhesive material 12. As a result of half-etching the first conductive film 33 by using a resist 14 as a mask, the salient 18 which is a thicker part, as well as the rest thinner part, are formed. After the salient 18 is formed, the resist 14 is removed.

Figure 3B:
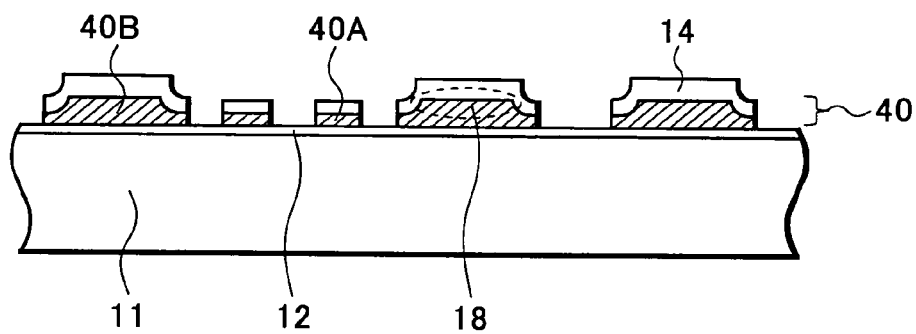

With reference to FIG. 3B, in a manner similar to the previous embodiment, the thinner part is etched so as to form a thick conductive pattern and a thin conductive pattern. Here, patterning of the resist 14 is performed in order that it covers a wider region than that of the salient 18. Subsequently, wet etching is conducted using the resist 14 as a mask to form a first wiring layer 40 composed of: a first conductive pattern 40A; and a second conductive pattern 40B which is formed to be thicker than the first conductive pattern 40A.

Figure 3C:
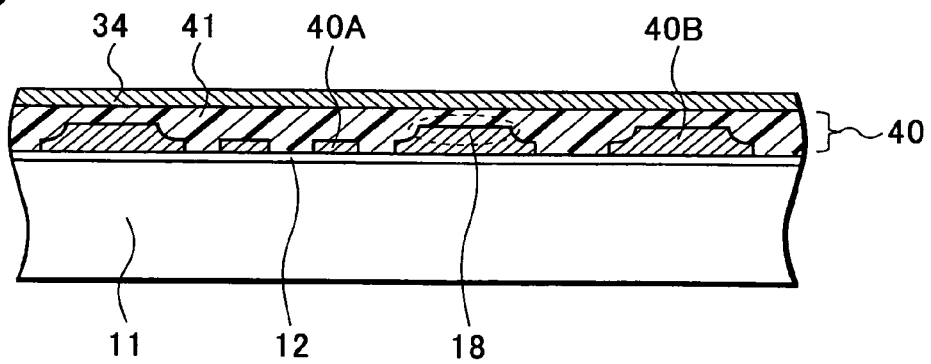

With reference to FIG. 3C, a second conductive film 34 is deposited on the top surface of the first wiring layer 40, with an insulation layer 41 interposed therebetween. This is achieved by closely adhering the second conductive film 34 where the insulation layer 41 formed of an adhesion layer or the like is provided on the surface, to the first wiring layer 40. It is also possible to deposit the second conductive film 34, after spreading the insulation layer 41 on the first wiring layer.

Here, the salient 18 is closely adhered by the insulation layer 41, in order that it is buried therein. By conducting this adhering process with a vacuum press, it becomes possible to prevent a void from being generated by the air between the first wiring layer 40 and the insulation layer 41. Moreover, the side surface of the salient 18 formed by isotropic etching is a smooth curved surface. Hence, upon burying the first wiring layer 40 into the insulation layer 41, resin infiltrates along the curve and thereby eliminates an unfilled part. Consequently, occurrence of a void can be suppressed also by the shape of the side surface of the salient 18. Further, the adhesion strength between the first wiring layer 40 and the insulation layer 41 can be improved by burying the salient 18 into the insulation layer 41.

In the embodiment, in order to improve the heat dissipation property, a dielectric resininto which filler is mixed, such as epoxy resin or the like, is adopted as the material for the insulation layer 41. Here, the material for the filler for mixing-in may be $SiO_2$, $Al_2O_3$, SiC, AlN or the like. Needless to say, resin without filler mixed therein can also be adopted for the insulation layer 41.

Figure 4A:
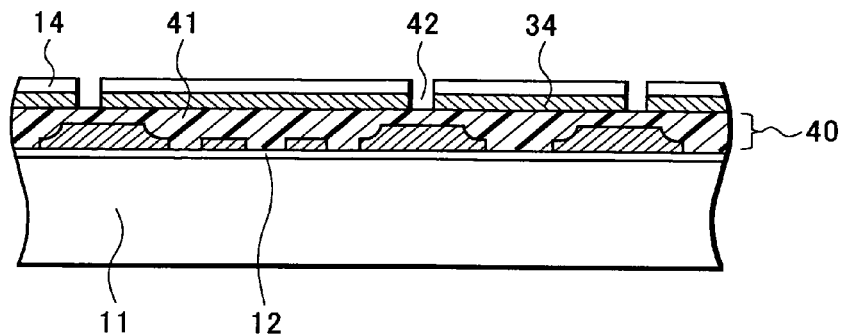
FIGS. 4A to 4C are sectional views showing the method of manufacturing a circuit device according to the second embodiment of the invention.
Figure 4B:
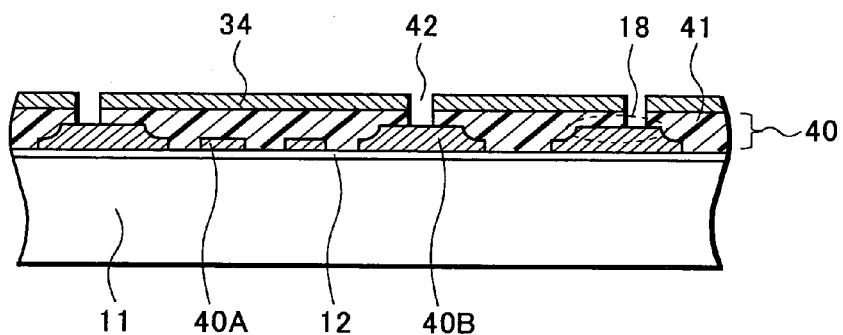
Figure 4C:
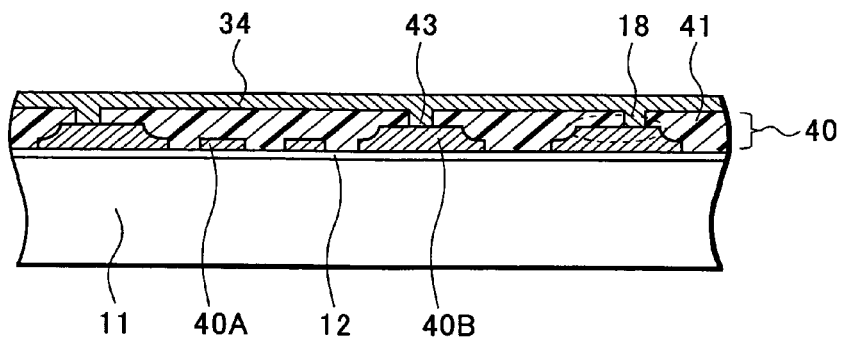

With reference to FIGS. 4A to 4C, a process of forming a contact part, which provides electrical continuity between the first wiring layer 40 and the second conductive film 34, is described. First, by using the resist 14 as a mask, etching of the region whereon a contact part 43 is to be formed is performed, and a through hole 42 is formed in order that the surface of the insulation film 41 is exposed. Subsequently, by irradiating a laser beam while using the second conductive film 34 as a mask, the salient 18 is exposed from the lowest part of the through hole 42. Thereafter, by forming a plated layer in the through hole 42, the contact part 43 is formed. The first wiring layer 40 and the second conductive film 34 can be provided with electrical continuity therebetween by forming the contact part 43.

The details of the forming process of the contact part 43 will be described later with reference to FIGS. 6A to 8B.

Figure 5A:
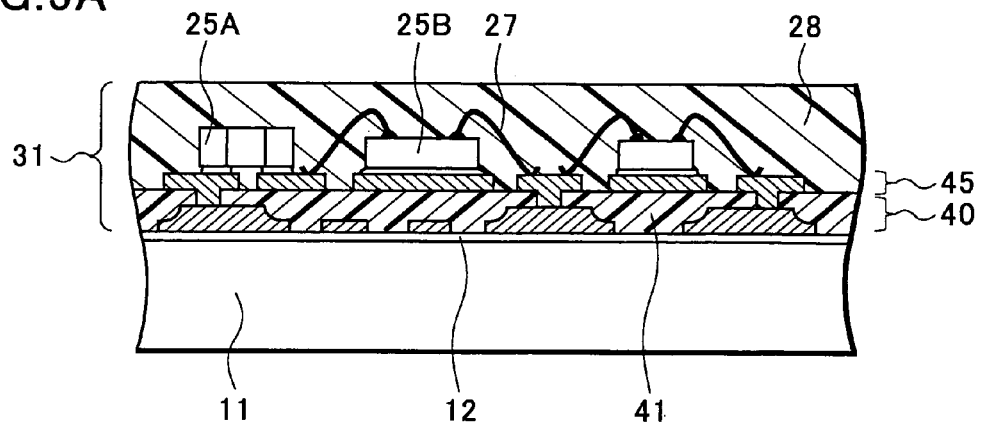
FIGS. 5A to 5C are sectional views showing the method of manufacturing a circuit device according to the second embodiment of the invention.

As shown in FIG. 5A, a second wiring layer 45 is formed by patterning the second conductive film 34. Subsequently, after electrically connecting circuit elements 25A and 25B on the second wiring layer 45, the package is sealed with the sealing resin 28.

Here, the first wiring layer 40 and the second conductive film 45 can be formed to intersect if seen in a plan view. Furthermore, the first wiring layer 40 and the second wiring layer 45 are interconnected at a predetermined location through the contact part 43. Consequently, in the case where the circuit elements 25A and 25B have a multiple number of electrodes, a multi-layered wiring structure enables crossover, thereby allowing the wiring to be flexibly routed. Needless to say, it is also possible to increase the number of stacked layers to three, four, five and more, depending on the number of electrodes in the circuit element, the package density, and the like.

While the second wiring layer 45 is formed with patterns with the same thickness in this embodiment, it can also be configured to have patterns with different thicknesses as described in FIGS. 1A to 1C. Hence, by forming thickly formed conductive patterns, the electric capacity can be ensured, and a heat sink function is provided thereto. Additionally, the contact part 43 can be allowed to serve as a thermal via.

Figure 5B:
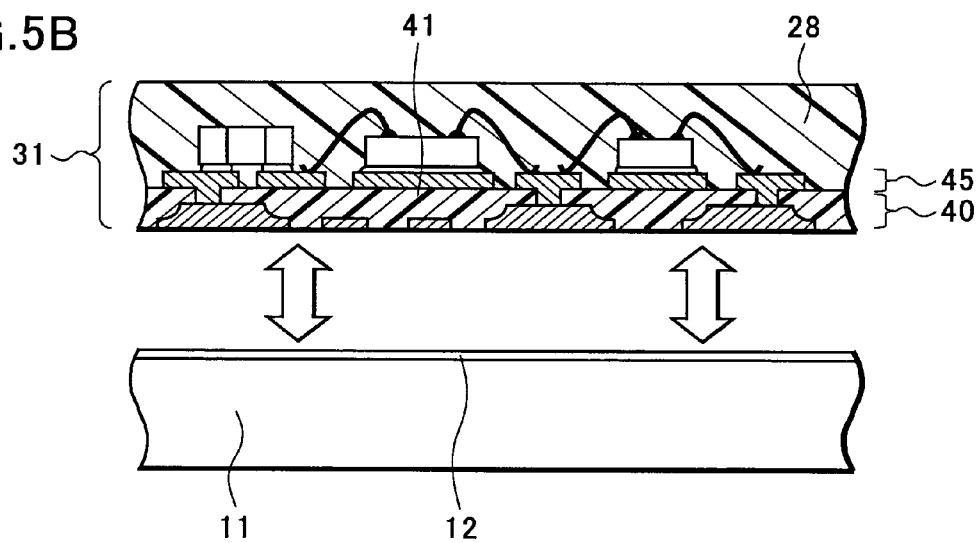
Figure 5C:
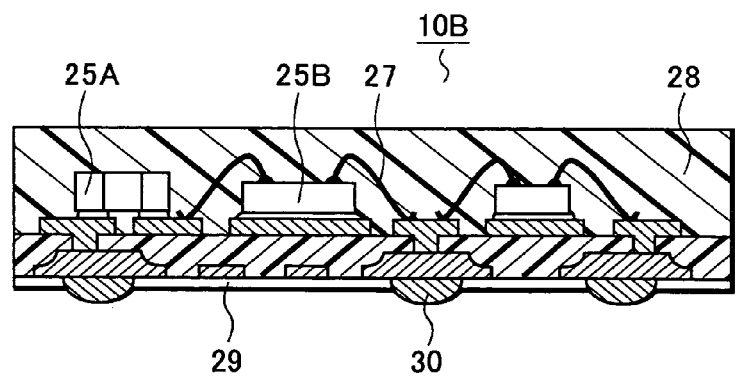

As shown in FIG. 5B, a resin sealed body 31 is separated from the supporting substrate 11. The method of the separation can be performed in the method mentioned previously. The resin sealed body 31 is then processed with a back surface treatment, and thereafter is diced and separated into pieces. Thus, a circuit device 10B as shown in FIG. 5C is completed.

The method of forming the contact part 43 is described with reference to FIGS. 6A to 8B.

Figure 6A:
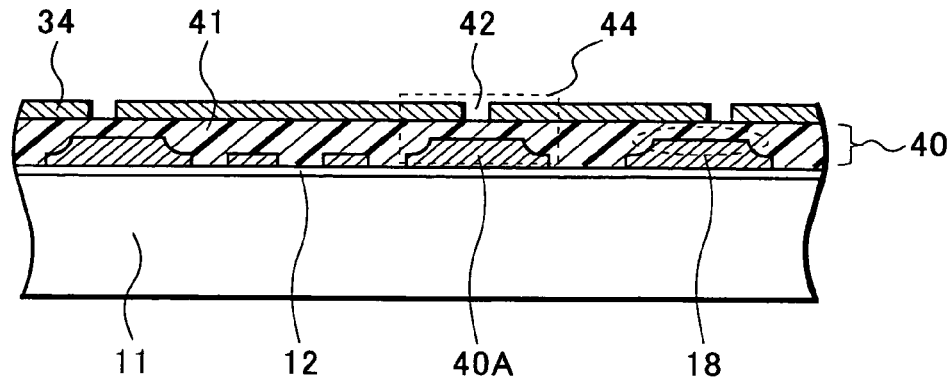
FIGS. 6A to 6C are sectional views showing the method of manufacturing a circuit device according to the second embodiment of the invention.

Referring to FIG. 6A, the second conductive film 34 is deposited on the top surface of the first wiring layer 40, with the insulation layer 41 interposed therebetween. Here, in the second conductive film 34, the region where the contact part 43 is to be formed is removed. In addition, a surface of the insulation layer 41 is exposed at the lowest part of the through hole 42. Moreover, filler is mixed into the insulation layer 41, in consideration of the improvement in heat dissipation property. First, magnified views of the contact part forming region 44 are shown in FIGS. 6B and 6C, and hereafter, the method of forming the through hole 42 will be described in detail.

Figure 6B:
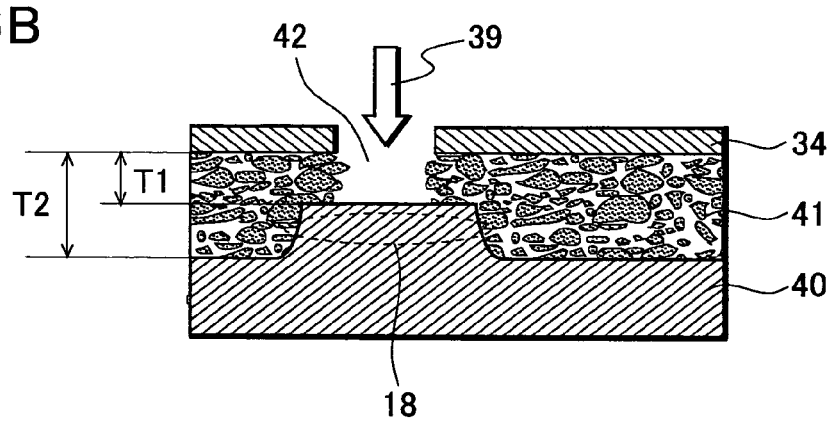
Figure 6C:
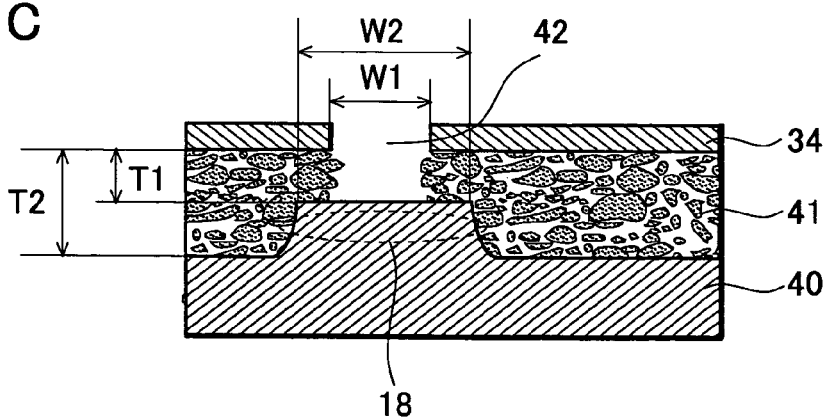

In the embodiment, as shown in FIG. 6B, the film thickness of the insulation layer 41 under the through hole 42 becomes thinner, since the salient 18 is buried therein. Subsequently, by removing the insulation film in the thinner region with the laser beam 39, the top surface of the salient 18 is exposed at the lowest part of the through hole 42. The thickness T2 for the major part of the insulation layer 41 is, for example, approximately 50 µm. On the other hand, the thickness T1 of the insulation layer 41 which corresponds to the lower part of the through hole 42 is thinner, which is, for example, approximately between 10 µm and 25 µm.

When the contact part 43 is formed by plating in the later process, the through hole 42 needs to be formed in a low aspect ratio. This is because if the aspect ratio is high, the mobility of plating liquid inside the through hole 42 worsens and the supply of the plating liquid becomes insufficient, thereby making the forming of the contact part 43 difficult.

Here, since the aspect ratio of the through hole 42 enabling the reliable contact part 43 to be formed by plating is confirmed to be 1 or less, the through hole 42 in the embodiment is formed with the aspect ratio of 1 or less. The aspect ratio mentioned here is a value indicated by L/D, where L is a depth of the through hole 42 and D is a diameter of the through hole 42.

Moreover, if filler for ensuring the heat dissipation property is mixed into the insulation layer 41, the forming of the through hole 42 with the laser beam becomes slightly difficult. In this case, it is beneficial to form the insulation layer 41 in which the through hole 42 is formed thin.

In FIG. 6C, a sectional view, after the through hole 42 is formed by the above-mentioned method, is shown. The top surface of the salient 18 is exposed from the bottom of the through hole 42. In addition, on the sidewall of the through hole 42 formed by a laser processing, the filler mixed into the insulation layer 41 is exposed. Particles of the filler mixed into the insulation layer 41 have a wide variety of diameters, so as to improve the heat dissipation property. Therefore, the sidewall of the through hole 42 has an irregular surface. In the case where there is a residue remaining in the bottom of the through hole 42 after the above-mentioned laser processing, a cleaning is conducted so as to remove the residue.

The planar size of the salient 18 is formed to be larger than that of the through hole 42 which is to be formed thereabove. In other words, the shapes of the through hole 42 and the salient 18 from a top view are both round, for example, and the diameter of the salient 18 is formed to be larger than that of the through hole 42. In a concrete example, if a diameter W1 of the through hole 42 is approximately 100 µm, then a diameter W2 of the salient 18 is formed to be approximately between 150 µm and 200 µm. Alternatively, if the diameter W1 of the through hole 42 is approximately from 30 µm to 50 µm, then the diameter W2 of the salient 18 is adjusted to be approximately from 50 µm to 70 µm. As described, by setting the planar size of the salient 18 larger than that of the through hole 42, the through hole 42 can be placed on the salient 18, even if the through hole 42 is formed in a slightly deviated position. Consequently, the connection reliability decline caused by the position deviation can be prevented. The shape of salient 18 from the top view can be other than a round shape.

Moreover, by forming the insulation film 41 with a first and a second resin films (not shown), it is possible to form the through hole 42 easily. Specifically, the lower part of the layer of the insulation layer 41 is formed with the first resin film. Here, the top surface of the first resin layer is set to be located at the same height as that of the salient 18. Thereafter, the second resin film is formed on the top surface of the first resin film. In the above, the first resin film is filled in with the filler in a high filling ratio so as to preserve the heat dissipation property, while the second resin film is filled in with the filler in a low filling ratio in order that the through hole 42 can be formed easily by the laser. Consequently, the above method serves to prevent jamming of the through hole 42 from occurring due to the residue of the filler inside the through hole or due to the filler flaking from the side surface of the through hole 42. Therefore, the forming of a highly reliable contact part becomes possible. Further, the diameters of filler particles mixed into the second resin film may be made small. Still further, the filler may not need to be mixed into the second resin film.

Moreover, another method can be applied for forming the through hole 42, although in the above-mentioned description, the through hole 42 is formed after covering the insulation layer 41 with the second conductive film 34. More specifically, the through hole 42 is formed by removing the insulation layer 41 before covering the second conductive film 34, and thus the top surface of the salient 18 can be exposed at the lowest part of the through hole 42. Here, a YAG (yttrium-aluminum-garnet) laser or wet etching can be adopted as a method for removing resin. Thereafter, the contact part 43 and the second conductive layer 34 can be formed with electroless plating. Moreover, by performing electroplating where the second conductive film 34 formed with electroless plating is used as a cathode, it is possible to form a conductive film with a certain degree of thickness.

Next, with reference to FIGS. 7A to 8B, processes of forming plated films on the through hole 42, forming the contact part 43, and providing electronic continuity between the first wiring layer 40 and the second conductive film 34, will be described. There are two possible methods for forming plated films. The first method is to perform film deposition of a plated film with electroless plating, and to subsequently perform film deposition of another plated film with electroplating again. The second method is to perform film deposition of plated films only with the electroplating processing.

Figure 7A:
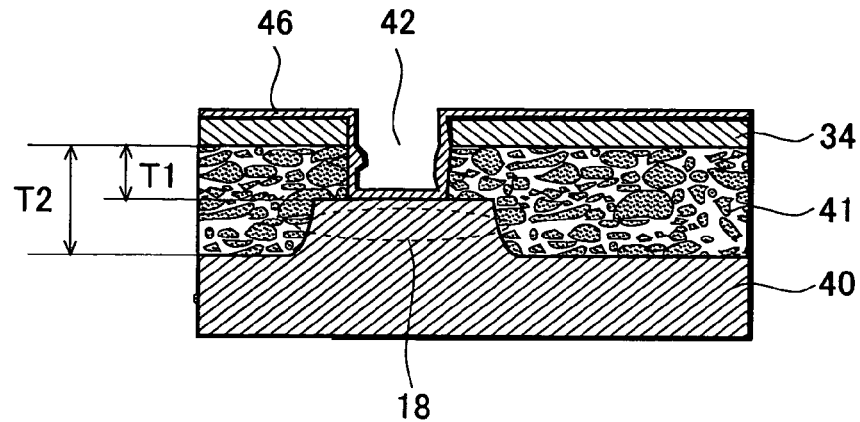
FIGS. 7A to 7C are sectional views showing the method of manufacturing a circuit device according to the second embodiment of the invention.

The first method of forming the plated film is described with reference to FIGS. 7A to 7C. First, as shown in FIG. 7A, a first plated film 46 is formed with electroless plating processing on the surface of the second conductive film 34, including the sidewall of the through hole 42. The thickness of the first plated film 46 can be set to approximately between 3 µm and 5 µm.

Figure 7B:
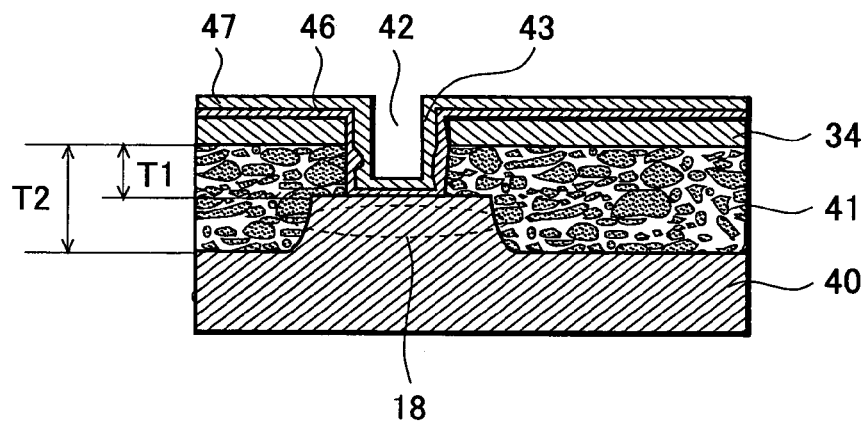

Subsequently, as shown in FIG. 7B, another film, i.e. a second plated film 47, is formed with an electroplating method on the surface of the first plated film 46, including the sidewall of the through hole 46. More specifically, by using the second conductive film 34 on which the first plated film 46 is formed as a cathode electrode, the second plated film 47 is additionally formed by way of an electroplating method. In the inner wall of the through hole 42, the first plated film 46 is formed with the electroless plating mentioned above. Therefore, the second plated film 47 formed in this process has an even thickness, including the inner wall of the through hole 42. As described, the contact part 43 is formed of the plated film. The specific example for the thickness of the second plated film 47 is approximately 20 µm. Materials for the first plated film 46 and the second plated film 47 mentioned above, may include copper, which is the same material as that of the second conductive film 34. Metals other than copper may also be adopted as a material for the first plated film 46 and the second plated film 47.

Figure 7C:
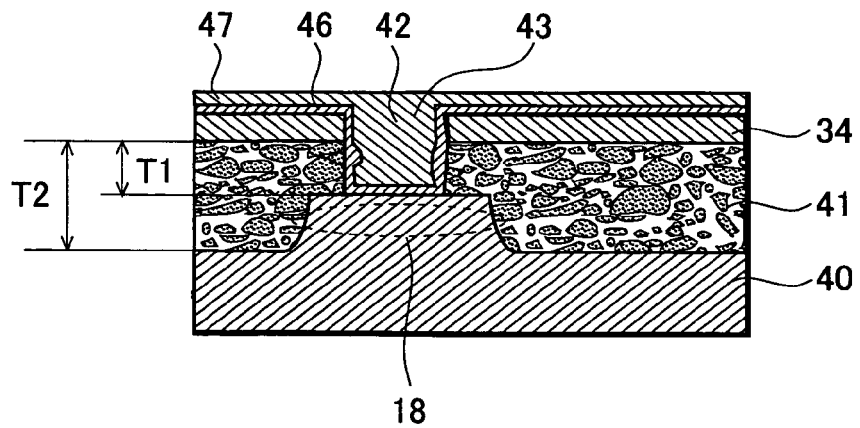

Referring to FIG. 7C, in this case, the through hole 42 is buried with the second plated film 47 with filling plating. Filling plating here enables to improve the mechanical strength of the contact part 43.

Hereafter, with reference to FIGS. 8A and 8B, methods of forming the contact part 43 with electroplating will be described.

Figure 8A:
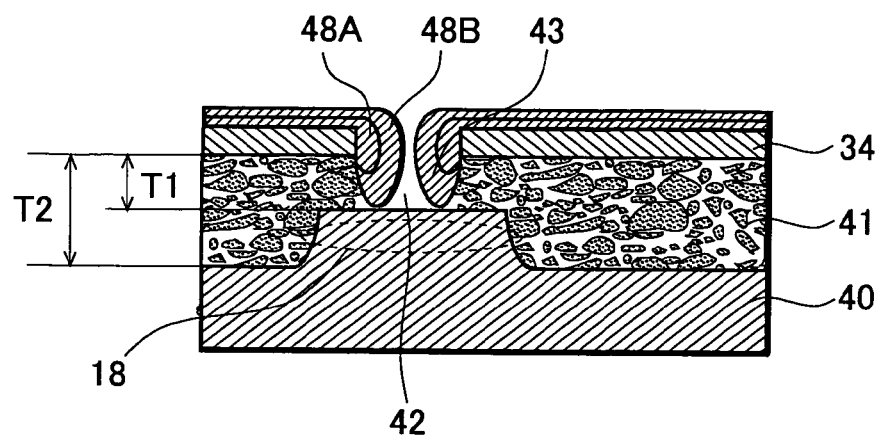
FIGS. 8A and 8B are sectional views showing the method of manufacturing a circuit device according to the second embodiment of the invention.
Figure 8B:
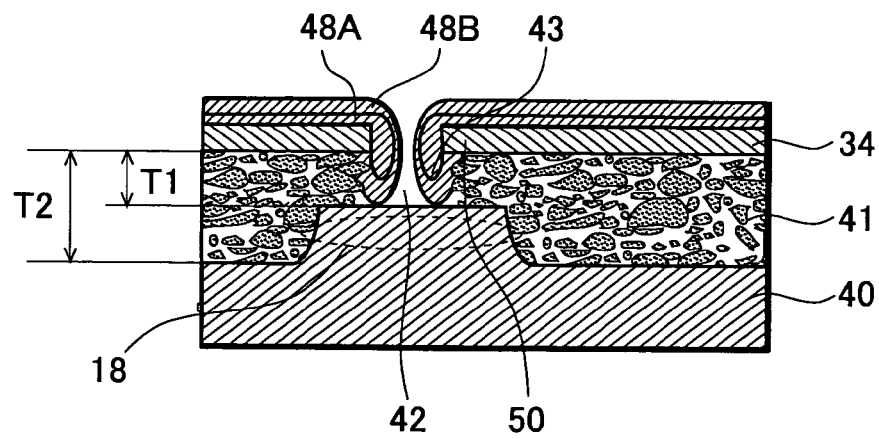
Figure 9A:
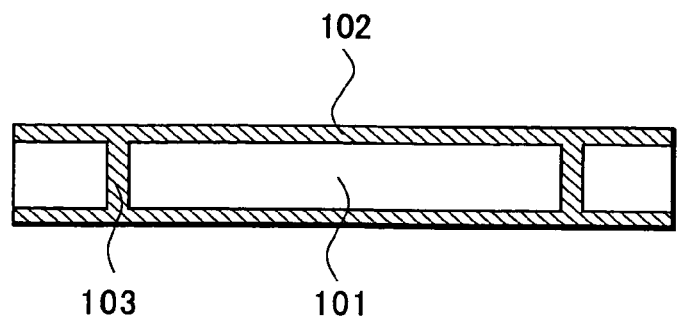
FIGS. 9A to 9C are sectional views showing a conventional method of manufacturing a circuit device.
Figure 9B:
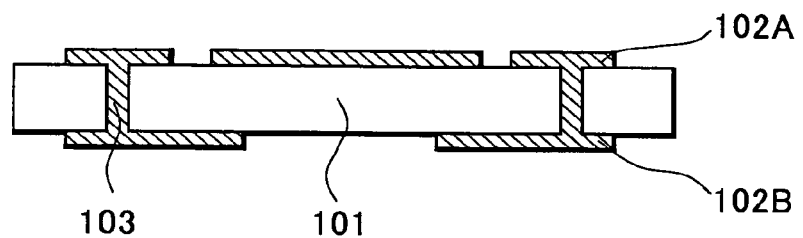
Figure 9C:
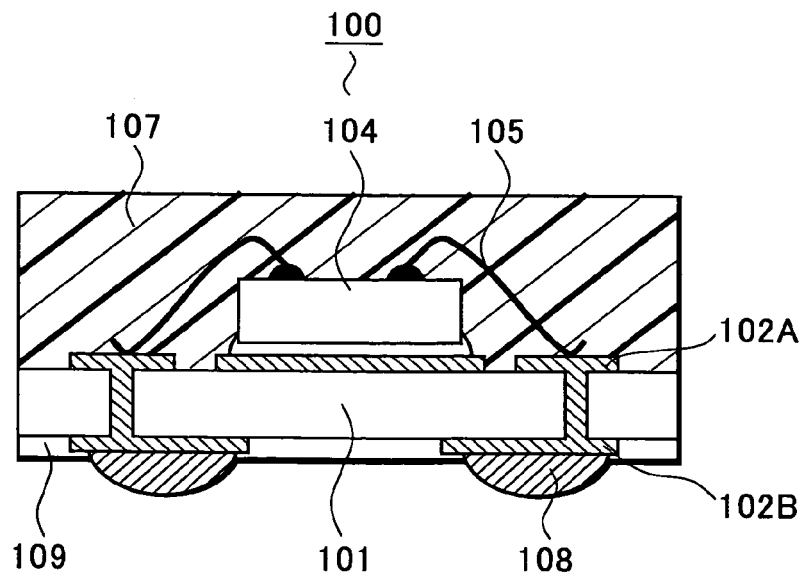

Referring to FIG. 8A, first, a liquid solution which includes metal ions is allowed to touch the through hole 42. Here, materials adoptable for a plated film 48 may include copper, gold, silver or palladium. Subsequently, an electric current is applied by using the second conductive film 34 as a cathode electrode, and metal is precipitated on the second conductive film 34 which serves as a cathode. Consequently, the plated film is formed. The way in which the plated film grows is represented by a 48A and a 48B in FIGS. 8A and 8B. In the electroplating method, a plated film is formed preferentially at the locations where the electric field is stronger. In the embodiment, the electric field becomes stronger at the part in the second conductive film 34 where it faces the perimeter part of the through hole 42. Hence, as shown in this drawing, the plated film grows preferentially from the part in the second conductive film 34 where it faces the perimeter part of the through hole 42. The first wiring layer 40 and the second conductive film 34 becomes electrically continuous at the time when the formed plated film touches the salient 18. Thereafter, the plated film is formed in a uniform manner inside the through hole 42. Consequently, the contact part 43 unified with the second conductive film 34 is formed inside the through hole 42.

Hereafter, another method of forming the contact part 43 will be described with reference to FIG. 8B. In this case, an overhang 50 is provided in a perimeter part of the through hole 42, thus enabling an easy formation of the contact part 43 with the electroplating method. The "overhang" mentioned here indicates a portion composed of the second conductive film 34 that overhangs in a way that it covers the perimeter part of the through hole 42. The specific method of manufacturing the overhang 50 is possible by increasing the laser's power output when the through hole 42 is formed with a laser beam. By increasing the laser's power output, the removal of the insulation layer 41 by the laser beam proceeds to a horizontal direction, and thus the resin in the lower region under the overhang 50 is removed. Subject to the above-mentioned condition, by conducting the electroplating processing where the second conductive film 34 is used as the cathode electrode, the plated film grows preferentially from the overhang 50. Since the plated film grows from the overhang 50, a plated film can be grown preferentially downward, compared to the case in FIG. 8A. Therefore, it becomes possible to ensure that the through hole 42 with the plated film.

As mentioned above, the sidewall of the through hole 42 in the embodiment has an irregular surface. In addition, at the sidewall of the through hole 42, the filler mixed into the insulation layer 41 is exposed. Hence, it is difficult to form the plated film on the sidewall of the through hole 42. In general, a plated film is hard to adhere onto a surface of filler that is composed of an inorganic substance. Specifically, if AlN is exposed on the sidewall of the through hole 42, the plated film is difficult to form. Therefore, in this embodiment, the contact part 43 is formed with the above-mentioned electroplating method.

Furthermore, for the case where the through hole 42 is buried by performing the filling plating, the filling plating can also be easily conducted since the through hole 42 is formed shallow, as described above.

In the embodiment, the location where the above-mentioned the salient 18 contacts the contact part 43 is positioned in a middle portion in the thickness-wise direction of the insulation film 41. Here, the "middle portion" means that it is above the top surface of the first wiring layer 40 and below the bottom surface of the second wiring layer 45. Hence, in the drawing, the location where the salient 18 contacts the contact part 43 is approximately at the central part of the insulation film in the direction of the thickness. The location can be changed within the range of the middle portion mentioned above. Considering that the contact part 43 is formed by the plating processing, it is desirable that the part where the salient 18 contacts the contact part 43 be arranged between the top surface of the first wiring layer 40 and the bottom surface of the second wiring layer 45 and above the mid point thereof. Consequently, there is an advantage, that the formation of the contact part 43 formed of plated film becomes easy. That is to say, when the through hole 42 is formed in order to form the contact part 43, the depth of the through hole 42 can be set shallow. Further, since the depth of the through hole 42 is shallow, the diameter thereof can also be set small. Still further, since the diameter of the through hole 42 is small, the space between the each through hole 42 can be narrowed. Therefore, a microscopic pattern can be realized as a whole, enabling miniaturization of a circuit device.

What is claimed is:

1. A method of manufacturing a circuit device, comprising:
    forming a first wiring layer on a top surface of a supporting substrate, having a salient protruding in the thickness-wise direction thereof;
    depositing a conductive film on the first wiring layer with an insulation layer interposed there-between;
    forming a contact part which provides electrical continuity between the salient and the conductive film;
    forming a second wiring layer by patterning the conductive film;
    connecting the second wiring layer and a circuit element electrically;
    sealing the top surface of the supporting substrate with a sealing resin in order that the circuit element is coated; and
    separating a back surface of the first wiring layer, and the insulation film from the supporting substrate,
    wherein the contact part is formed by: partly removing the conductive film to expose the insulation layer; forming a through hole by removing the exposed insulation layer; and forming a plated film on the through hole.

2. The method of manufacturing a circuit device according to claim 1, wherein the plated film is formed by: forming a plated film on the sidewall of the through hole by electroless plating processing; and thereafter forming another plated film on the through hole by electroplating processing.

3. The method of manufacturing a circuit device according to claim 1, wherein, by conducting electroplating processing using the conductive film as an electrode, the plated film is formed toward a inside of the through hole from the conductive film located around a perimeter part of the through hole.

4. The method of manufacturing a circuit device according to claim 3, wherein:
    an overhang formed of the conductive film is formed around the perimeter part of the through hole; and
    the plated film is formed from the overhang toward the inside of the through hole.

5. The method of manufacturing a circuit device according to claim 1, wherein filler is mixed into the insulation layer.

6. A method of manufacturing a circuit device, comprising:
    forming a first wiring layer on a top surface of a supporting substrate, having a salient protruding in the thickness-wise direction thereof;
    depositing a conductive film on the first wiring layer with an insulation layer interposed there-between;
    forming a contact part which provides electrical continuity between the salient and the conductive film;
    forming a second wiring layer by patterning the conductive film;
    connecting the second wiring layer and a circuit element electrically;
    sealing the top surface of the supporting substrate with a sealing resin in order that the circuit element is coated; and
    separating a back surface of the first wiring layer, and the insulation film from the supporting substrate or
    a method of manufacturing a circuit device, comprising:
    forming a wiring layer on a supporting substrate, the wiring layer being composed of a first conductive pattern and a second conductive pattern, the second conductive pattern being formed to be thicker than the first conductive pattern;
    connecting the wiring layer and a circuit element electrically;
    sealing a top surface of the supporting substrate with a sealing resin in order that the circuit element is coated; and
    separating a back surface of the wiring layer and the sealing resin from the supporting substrate, wherein:
    the supporting substrate and the first wiring layer are adhered with an adhesive material interposed there between; and
    the back surface of the first wiring layer, the insulation layer, and the sealing resin are separated from the supporting substrate, after adhesion strength of the adhesive material is reduced.

7. A method of manufacturing a circuit device, comprising:
    forming a wiring layer on a supporting substrate, the wiring layer being composed of a first conductive pattern and a second conductive pattern, the second conductive pattern being formed to be thicker than the first conductive pattern;
    connecting the wiring layer and a circuit element electrically;
    sealing a top surface of the supporting substrate with a sealing resin in order that the circuit element is coated; and
    separating a back surface of the wiring layer and the sealing resin from the supporting substrate,
    wherein an edge having substantially the same thickness as that of the first conductive pattern is formed around the second conductive pattern.

* * * * *